(12) United States Patent
Almeida Loya et al.

(10) Patent No.: US 11,543,650 B2
(45) Date of Patent: Jan. 3, 2023

(54) SCANNING MIRROR ASSEMBLY WITH A SCANNING MIRROR ELEVATED ABOVE A MEMS ACTUATOR

(71) Applicant: BEIJING VOYAGER TECHNOLOGY CO., LTD., Beijing (CN)

(72) Inventors: Sergio Fabian Almeida Loya, Mountain View, CA (US); Qin Zhou, Mountain View, CA (US); Youmin Wang, Berkeley, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 83 days.

(21) Appl. No.: 17/238,174

(22) Filed: Apr. 22, 2021

(65) Prior Publication Data
US 2022/0342200 A1    Oct. 27, 2022

(51) Int. Cl.
*G02B 26/08*   (2006.01)
*B81B 3/00*    (2006.01)
*G01S 7/481*   (2006.01)
*G01S 17/08*   (2006.01)

(52) U.S. Cl.
CPC ........ *G02B 26/0833* (2013.01); *B81B 3/0018* (2013.01); *G01S 7/4817* (2013.01); *G01S 17/08* (2013.01); *B81B 2201/047* (2013.01)

(58) Field of Classification Search
CPC .............. G02B 26/0833; B81B 3/0018; B81B 2201/047; G01S 7/4817; G01S 17/08
See application file for complete search history.

(56) References Cited

U.S. PATENT DOCUMENTS

| 6,930,051 B1* | 8/2005 | Manginell | H01L 21/3083 438/735 |
| 7,271,946 B2* | 9/2007 | Esashi | G02B 26/0841 345/85 |
| 8,816,565 B2* | 8/2014 | Hung | H02N 1/002 310/309 |
| 2002/0111031 A1* | 8/2002 | Chase | G01P 15/0888 438/712 |
| 2005/0194650 A1* | 9/2005 | Hung | B81B 3/0045 257/419 |

(Continued)

OTHER PUBLICATIONS

International Search Report issued in corresponding International Application No. PCT/US2021/062270, dated Apr. 18, 2022, 3 pages.

(Continued)

*Primary Examiner* — Roy M Punnoose
(74) *Attorney, Agent, or Firm* — Bayes PLLC (57) ABSTRACT

Embodiments of the disclosure include a scanning mirror assembly for an optical sensing system. The scanning mirror assembly may include a scanning mirror formed in a first layer of the scanning mirror assembly. The scanning mirror assembly may also include a MEMS actuator formed in a second layer of the scanning mirror assembly, where the first layer is a predetermined distance above the second layer. The MEMS actuator may also include a plurality of stator actuator features and a plurality of rotatable actuator features formed from a same semiconductor layer during a fabrication process.

16 Claims, 8 Drawing Sheets

(56) References Cited

U.S. PATENT DOCUMENTS

| | | | |
|---|---|---|---|
| 2006/0071578 A1* | 4/2006 | Drabe | G01C 19/5642 |
| | | | 310/309 |
| 2007/0063614 A1* | 3/2007 | Tsuboi | H02N 1/008 |
| | | | 359/290 |
| 2010/0033788 A1 | 2/2010 | Xie et al. | |
| 2011/0109194 A1* | 5/2011 | Hung | H02N 1/008 |
| | | | 310/300 |
| 2018/0210165 A1 | 7/2018 | Yasumura | |
| 2018/0210224 A1 | 7/2018 | Kilcher et al. | |
| 2018/0314057 A1 | 11/2018 | Yasumura | |
| 2020/0209615 A1 | 7/2020 | Lee et al. | |

OTHER PUBLICATIONS

Written Opinion of the International Searching Authority issued in corresponding International Application No. PCT/US2021/062270, dated Apr. 18, 2022, 3 pages.

* cited by examiner

SCANNING MIRROR ASSEMBLY WITH A SCANNING MIRROR ELEVATED ABOVE A MEMS ACTUATOR

TECHNICAL FIELD

The present disclosure relates to a scanning mirror assembly for an optical sensing system, and more particularly to, a scanning mirror assembly that comprises a scanning mirror elevated above a microelectromechanical system (MEMS) actuator by a predetermined distance.

BACKGROUND

Optical sensing systems, e.g., such as LiDAR systems, have been widely used in advanced navigation technologies, such as to aid autonomous driving or to generate high-definition maps. For example, a typical LiDAR system measures the distance to a target by illuminating the target with pulsed laser light beams that are steered towards an object in the far field using a scanning mirror, and then measuring the reflected pulses with a sensor. Differences in laser light return times, wavelengths, and/or phases can then be used to construct digital three-dimensional (3D) representations of the target. Because using a narrow laser beam as the incident light can map physical features with very high resolution, a LiDAR system is particularly suitable for applications such as sensing in autonomous driving and high-definition map surveys.

In many optical sensing systems, MEMS mirrors are arranged in a closely packed array and configured to steer a laser beam towards an object in the far field when driven by, e.g., a MEMS actuator. In such systems, it may be beneficial to maximize the "optical fill factor" of the array such that the optical surface area of each MEMS mirror in the array is as large as possible relative to its area of support on the substrate. However, in conventional MEMS mirror assemblies, the MEMS actuator is usually formed in the same layer as the mirror, thus occupying a portion of the surface and limiting the size of the mirror surface. This may result in a less than optimal optical fill factor, e.g., seventy-five percent or lower. This may be particularly true for mirrors use a comb drive with rotatable comb drive fingers coupled to the MEMS mirror and stator comb drive fingers coupled to anchors positioned on either side of the mirror. In a typical MEMS array, the comb drive fingers are not part of the reflecting area, thereby reducing the optical efficiency, and hence the fill factor, of such a system.

Hence, there is an unmet need for MEMS mirror assembly that is designed to optimize the reflective surface area of the MEMS mirrors and the fill factor of the array.

SUMMARY

Embodiments of the disclosure include a scanning mirror assembly for an optical sensing system. The scanning mirror assembly may include a scanning mirror formed in a first layer of the scanning mirror assembly. The scanning mirror assembly may also include a MEMS actuator formed in a second layer of the scanning mirror assembly, where the first layer is a predetermined distance above the second layer. The MEMS actuator may also include a plurality of stator actuator features and a plurality of rotatable actuator features formed from a same semiconductor layer during a fabrication process.

Embodiments of the disclosure may include a transmitter for an optical sensing system. The transmitter may include a light source configured to emit a light beam towards an object. The transmitter may also include a scanning mirror assembly. The scanning mirror assembly may include a scanning mirror formed in a first layer of the scanning mirror assembly. The scanning mirror assembly may also include a MEMS actuator formed in a second layer of the scanning mirror assembly, where the first layer is a predetermined distance above the second layer. The MEMS actuator may include a plurality of stator actuator features and a plurality of rotatable actuator features formed from a same semiconductor layer during a fabrication process.

Embodiments of the disclosure may include a method of forming a scanning mirror assembly. The method may include bonding a first wafer that includes a handle and a set of actuator anchors to a second wafer that includes a scanning mirror layer. The method may also include removing the first wafer except for the handle and the set of actuator anchors. The method may further include bonding a third wafer that includes an actuator layer to the second wafer. The method may further include etching the third wafer to form a first set of actuator features and a second set of actuator features from the actuator layer. The method may also include bonding a fourth wafer that includes a plurality of interconnects and a plurality of scanning mirror anchors to the third wafer. The method may further include etching the second wafer to release the scanning mirror layer.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

LiDAR is an optical sensing technology that enables autonomous vehicles to "see" the surrounding world, creating a virtual model of the environment to facilitate decision-making and navigation. An optical sensor (e.g., LiDAR transmitter and receiver) creates a 3D map of the surrounding environment using laser beams and time-of-flight (ToF) distance measurements. ToF, which is one of LiDAR's operational principles, provides distance information by measuring the travel time of a collimated laser beam to reflect off an object and return to the sensor. Reflected light signals are measured and processed at the vehicle to detect, identify, and decide how to interact with or avoid objects.

Due to the challenges imposed by the fill factor constraints caused by forming the scanning mirror and MEMS actuator in the same semiconductor layer, as discussed in the BACKGROUND section above, the present disclosure provides a scanning mirror assembly in which the scanning mirror is formed in a first layer and the MEMS actuator formed in a second layer, which is located under the first layer by a predetermined distance. This arrangement increases the fill factor by elevating the reflective surface of the scanning mirror above its corresponding actuator. This enables the surface area of the present scanning mirror to be increased so that it fills in the space that would otherwise have been occupied by the MEMS actuator in a conventional assembly. At the same time, by forming interdigitated stator and rotatable features of the MEMS actuator in the same semiconductor layer, issues of misalignment, which may otherwise occur when the stator and rotatable features are formed from separate layers, may be mitigated. Thus, the scanning mirror assembly of the present disclosure not only has an improved fill factor, but its performance and lifespan may also be enhanced by mitigating misalignment between corresponding stator and rotatable features of the MEMS actuator.

Some exemplary embodiments are described below with reference to a scanner used in LiDAR system(s), but the application of the emitter array disclosed by the present disclosure is not limited to the LiDAR system. Rather, one of ordinary skill would understand that the following description, embodiments, and techniques may apply to any type of optical sensing system (e.g., biomedical imaging, 3D scanning, tracking and targeting, free-space optical communications (FSOC), and telecommunications, just to name a few) known in the art without departing from the scope of the present disclosure.

Figure 1:
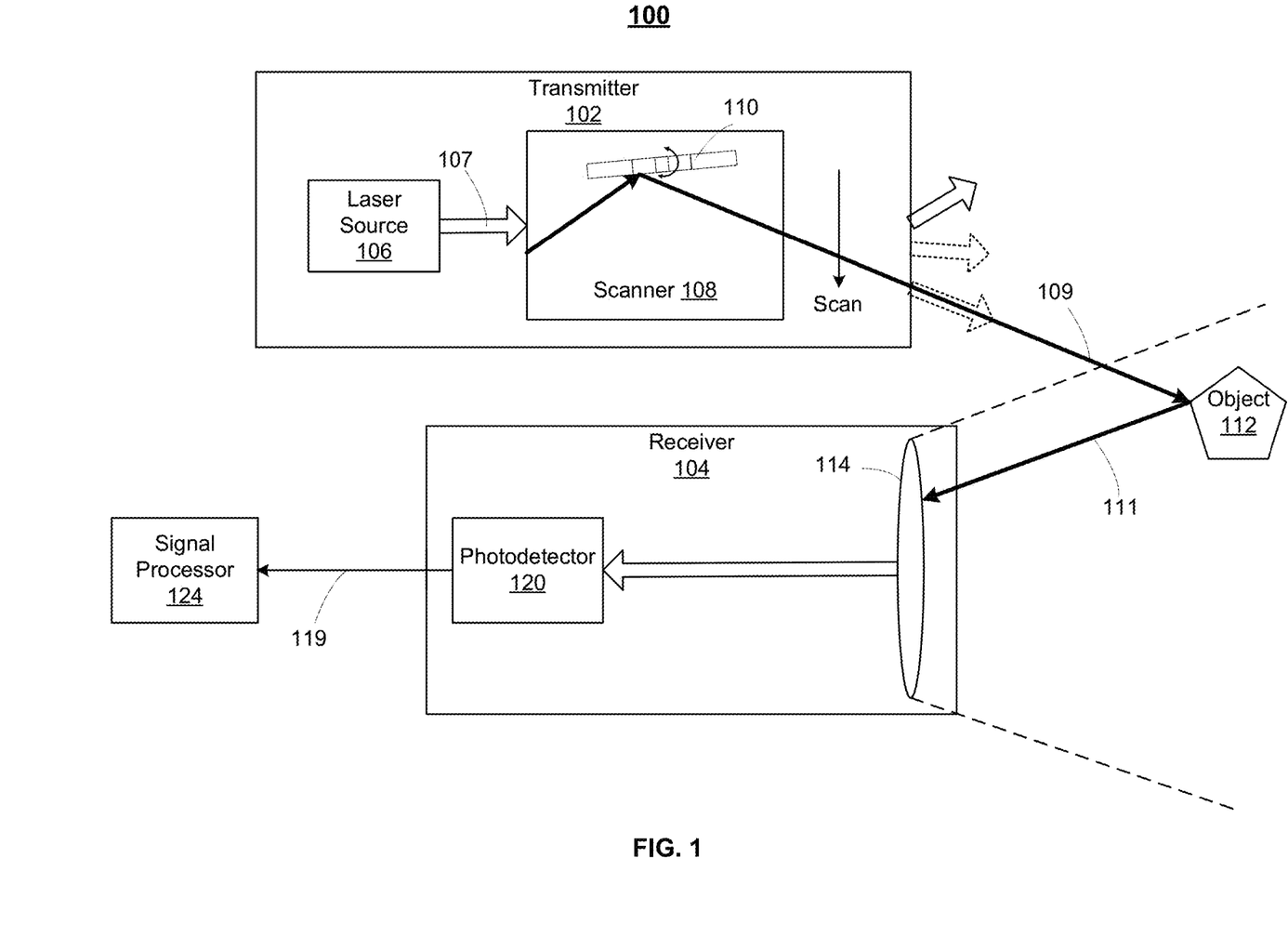
FIG. 1 illustrates a block diagram of an exemplary LiDAR system, according to embodiments of the disclosure.

FIG. 1 illustrates a block diagram of an exemplary LiDAR system 100, according to embodiments of the disclosure. LiDAR system 100 may include a transmitter 102 and a receiver 104. Transmitter 102 may emit laser beams along multiple directions. Transmitter 102 may include one or more laser sources 106 and a scanner 108. Collimating scanner 108 eliminates the need for a collimating lens in the transmitter 102. Thus, a collimating lens may be omitted from transmitter 102.

Transmitter 102 can sequentially emit a stream of pulsed laser beams in different directions within a scan range (e.g., a range in angular degrees), as illustrated in FIG. 1. Laser source 106 may be configured to provide a laser beam 107 (also referred to as "native laser beam") to collimating scanner 108. In some embodiments of the present disclosure, laser source 106 may generate a pulsed laser beam in the ultraviolet, visible, or near infrared wavelength range. Laser beam 107 may diverge in the space between the laser source 106 and the collimating scanner 108.

In some embodiments of the present disclosure, laser source 106 may include a pulsed laser diode (PLD), a vertical-cavity surface-emitting laser (VCSEL), a fiber laser, etc. For example, a PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of incident laser beam 107 provided by a PLD may be greater than 700 nm, such as 760 nm, 785 nm, 808 nm, 848 nm, 905 nm, 940 nm, 980 nm, 1064 nm, 1083 nm, 1310 nm, 1370 nm, 1480 nm, 1512 nm, 1550 nm, 1625 nm, 1654 nm, 1877 nm, 1940 nm, 2000 nm, etc. It is understood that any suitable laser source may be used as laser source 106 for emitting laser beam 107.

Scanner 108 may be configured to emit a collimated laser beam 109 to an object 112 (e.g., stationary objects, moving objects, people, animals, trees, fallen branches, debris, metallic objects, non-metallic objects, rocks, rain, chemical compounds, aerosols, clouds and even single molecules, just to name a few) in a direction within a range of scanning angles. In some embodiments consistent with the present disclosure, scanner 108 may include a micromachined mirror assembly (also referred to herein as "scanning mirror assembly") that is comprised of a plurality of elements. One such element is a scanning mirror, such as a MEMS mirror 110 illustrated in FIG. 1. Although not shown in FIG. 1, the scanning mirror assembly of scanner 108 may also include various other elements. For example, these other elements may include, without limitation, a MEMS actuator, actuator anchor(s), a handle that couples MEMS mirror 110 to the MEMS actuator and maintains a predetermined distance therebetween, a plurality of interconnects, scanning mirror anchor(s), just to name a few.

Moreover, the scanning mirror assembly may include a plurality of layers oriented vertically with respect to the reflective surface of MEMS mirror 110. Each of the elements described above may be formed in at least one the layer of the scanning mirror assembly. In order to increase the fill factor of MEMS mirror 110, the MEMS actuator may be formed in a separate layer a certain distance beneath the layer that includes MEMS mirror 110.

By way of example and not limitation, MEMS mirror 110 may be formed in a first layer, which may be referred to as the "top layer." The MEMS actuator may be formed in a second layer that is located beneath the first layer by a predetermined distance. The actuator anchors may also be formed in the second layer. The handle, which couples MEMS mirror 110 and the MEMS actuator, may be part of a third layer. As discussed in additional detail below in connection with FIG. 3E, the third layer may be located between the first layer and the second layer). The interconnects may be formed in a fourth layer located beneath the second layer. The plurality of scanning mirror anchors may also be formed in the fourth layer.

In certain embodiments, each of the elements may be formed in their respective layers during a fabrication process of the scanning mirror assembly. For example, an exemplary fabrication process (described in connection with FIGS. 3A-3D and 4) may include, among others, bonding and etching a series of Silicon-on-Insulator (SOI) wafer(s) that form a scanning mirror in a first layer, a MEMS actuator in a second layer located a predetermined distance under the first layer, and a handle configured to couple the scanning mirror and the MEMS actuator, which is located in a third layer located between the first and second layers.

In some embodiments, receiver 104 may be configured to detect a returned laser beam 111 returned from object 112. The returned laser beam 111 may be in a different direction from laser beam 109. Receiver 104 can collect laser beams returned from object 112 and output electrical signals reflecting the intensity of the returned laser beams. Upon contact, laser light can be reflected by object 112 via backscattering, e.g., such as Raman scattering and fluorescence. As illustrated in FIG. 1, receiver 104 may include a lens 114 and a photodetector 120. Lens 114 may be configured to collect light from a respective direction in its FOV and converge the laser beam to focus before it is received on photodetector 120. At each time point during the scan, returned laser beam 111 may be collected by lens 114. Returned laser beam 111 may be returned from object 112 and have the same wavelength as laser beam 109.

Photodetector 120 may be configured to detect returned laser beam 111 returned from object 112. In some embodiments, photodetector 120 may convert the laser light (e.g., returned laser beam 111) collected by lens 114 into an electrical signal 119 (e.g., a current or a voltage signal). Electrical signal 119 may be generated when photons are absorbed in a photodiode included in photodetector 120. In some embodiments of the present disclosure, photodetector 120 may include a PIN detector, a PIN detector array, an avalanche photodiode (APD) detector, a APD detector array, a single photon avalanche diode (SPAD) detector, a SPAD detector array, a silicon photo multiplier (SiPM/MPCC) detector, a SiP/MPCC detector array, or the like.

LiDAR system 100 may also include one or more signal processor 124. Signal processor 124 may receive electrical signal 119 generated by photodetector 120. Signal processor 124 may process electrical signal 119 to determine, for example, distance information carried by electrical signal 119. Signal processor 124 may construct a point cloud based on the processed information. Signal processor 124 may include a microprocessor, a microcontroller, a central processing unit (CPU), a graphical processing unit (GPU), a digital signal processor (DSP), or other suitable data processing devices.

Figure 2A:
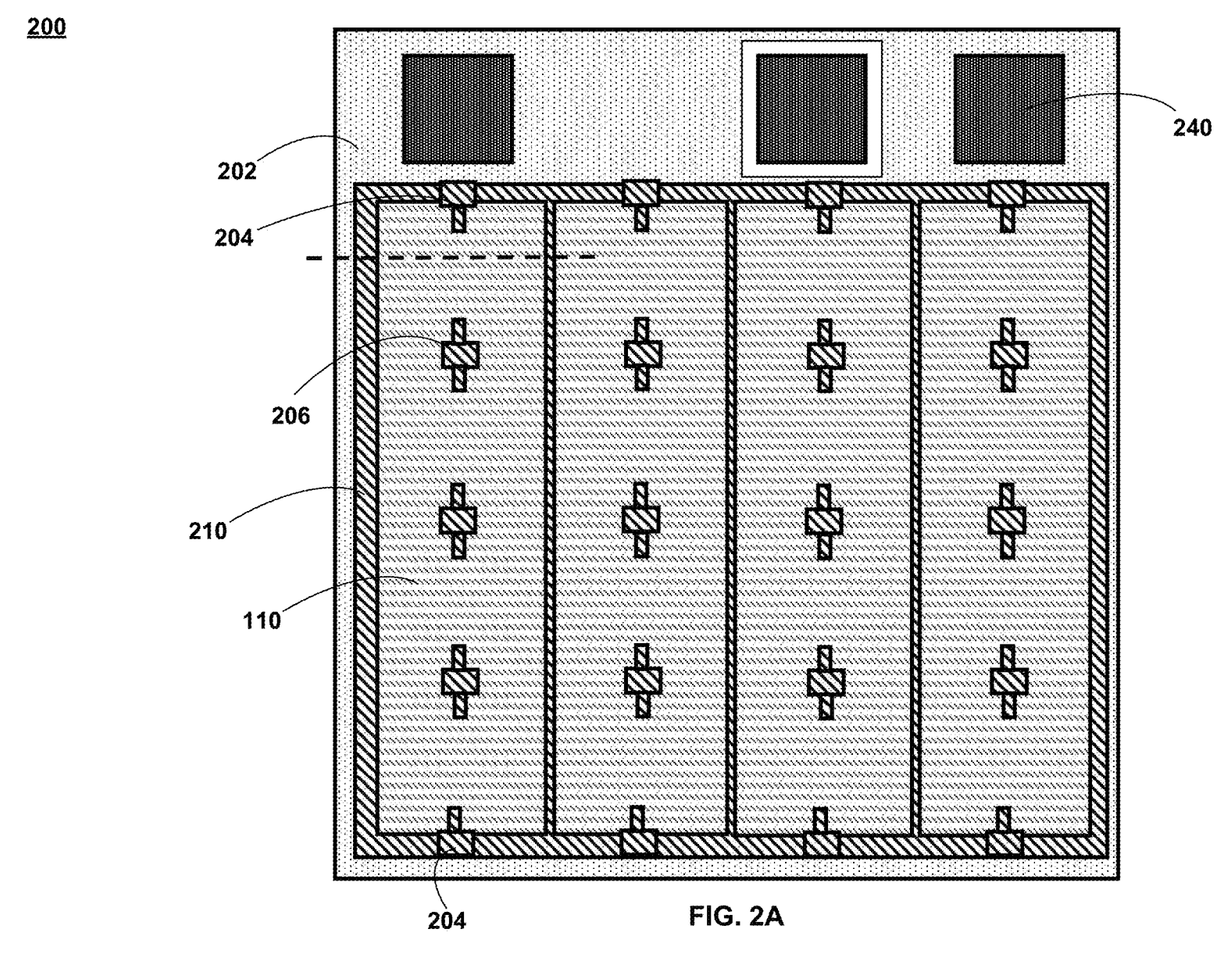
FIG. 2A illustrates a detailed view of a first layer of an exemplary scanning mirror assembly that includes the scanning mirror(s), according to embodiments of the disclosure.
Figure 2B:
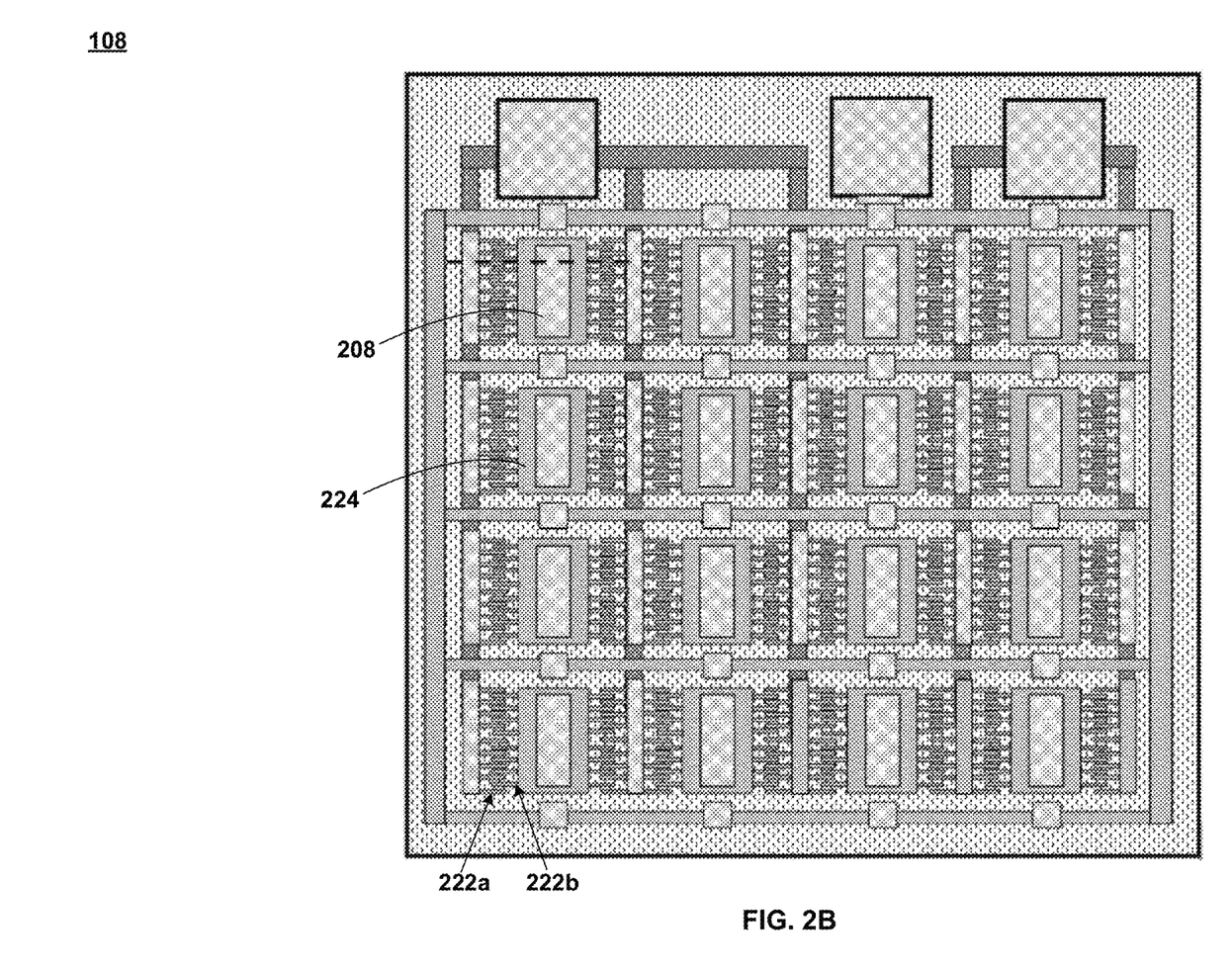
FIG. 2B illustrates a detailed view of a second layer of an exemplary scanning mirror assembly that includes actuator features located under the scanning mirror(s) depicted in FIG. 2A, according to embodiments of the disclosure.
Figure 3A:
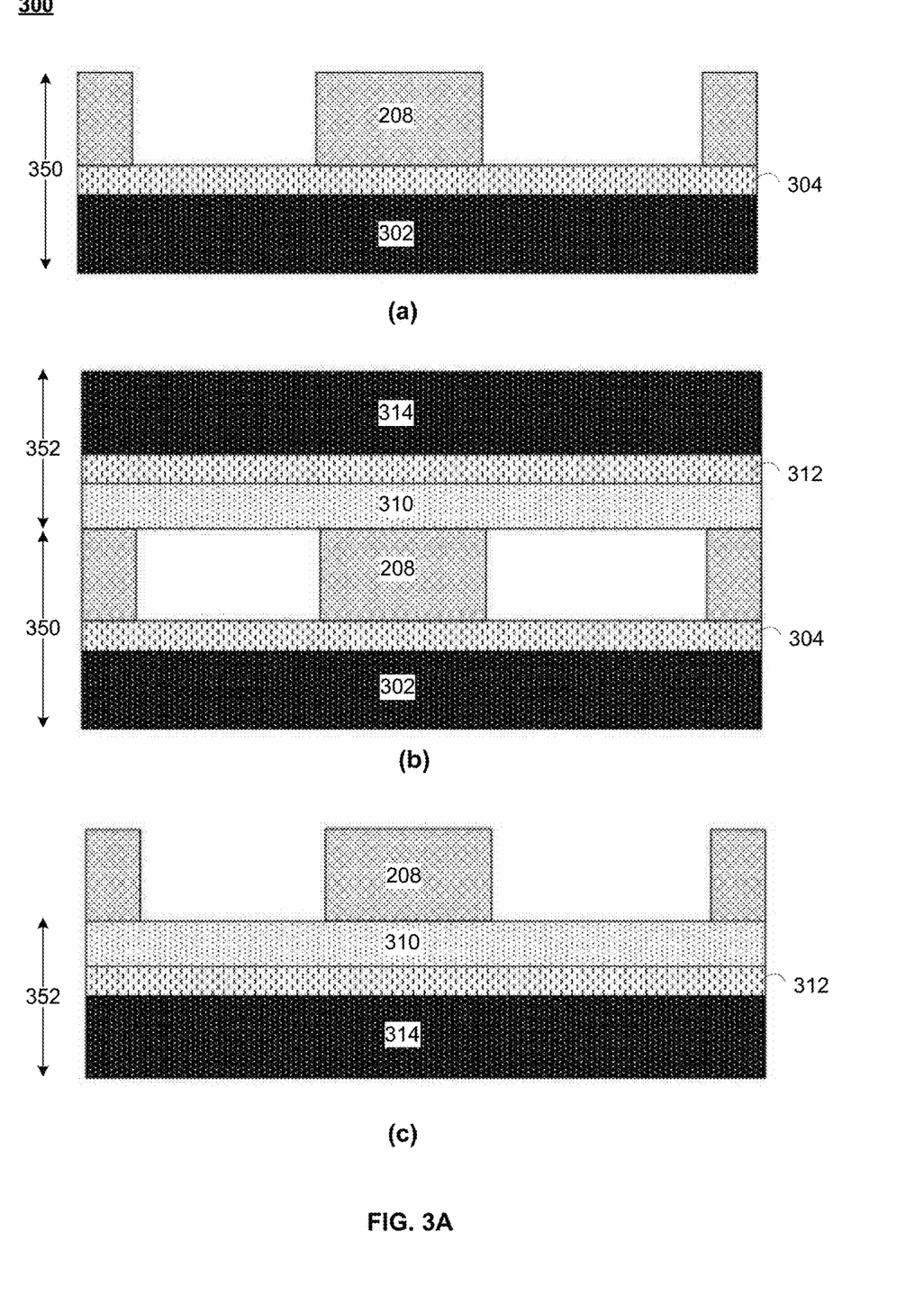
FIGS. 3A-3D illustrate an exemplary process flow for fabricating a scanning mirror assembly, according to embodiments of the disclosure.
Figure 3B:
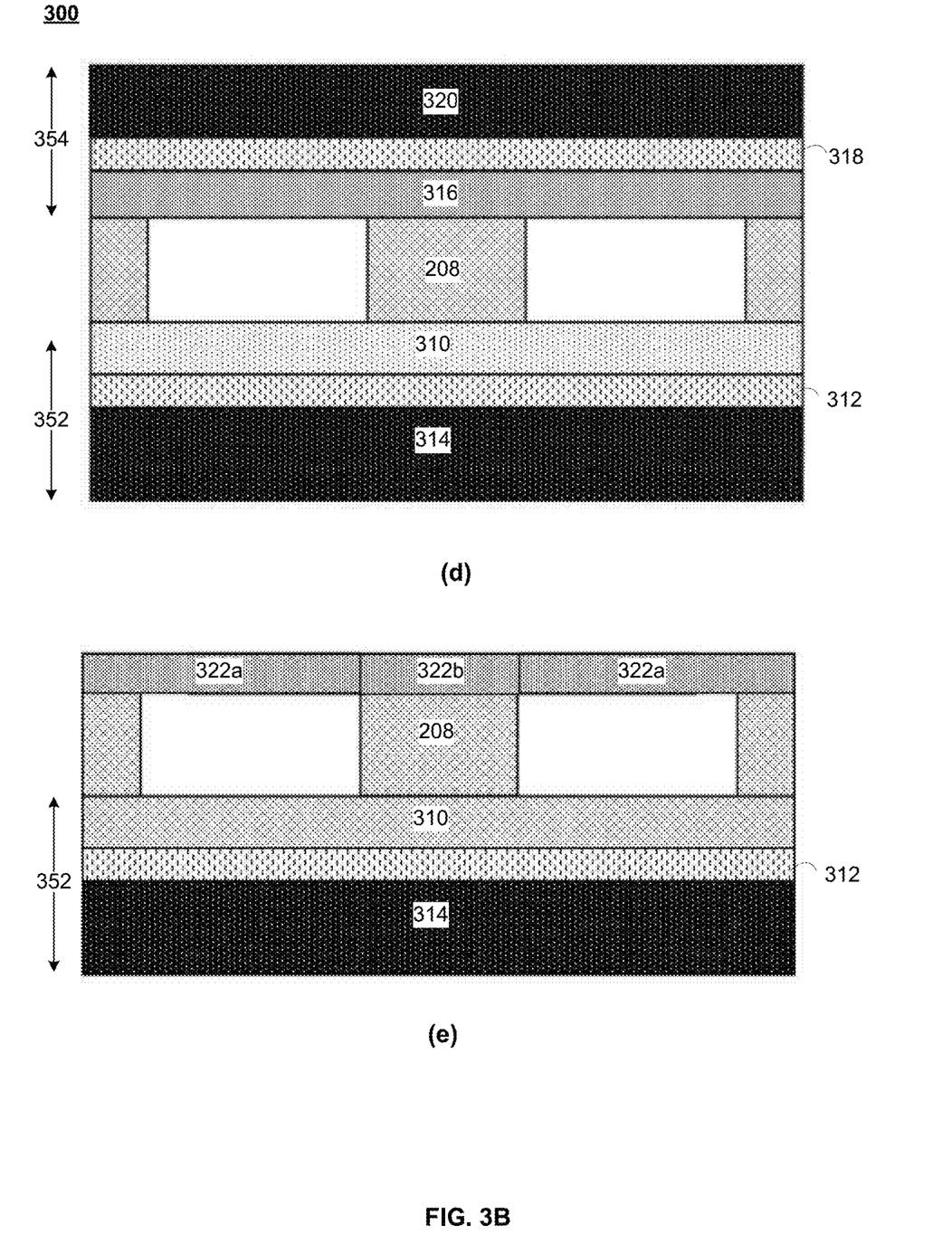
Figure 3C:
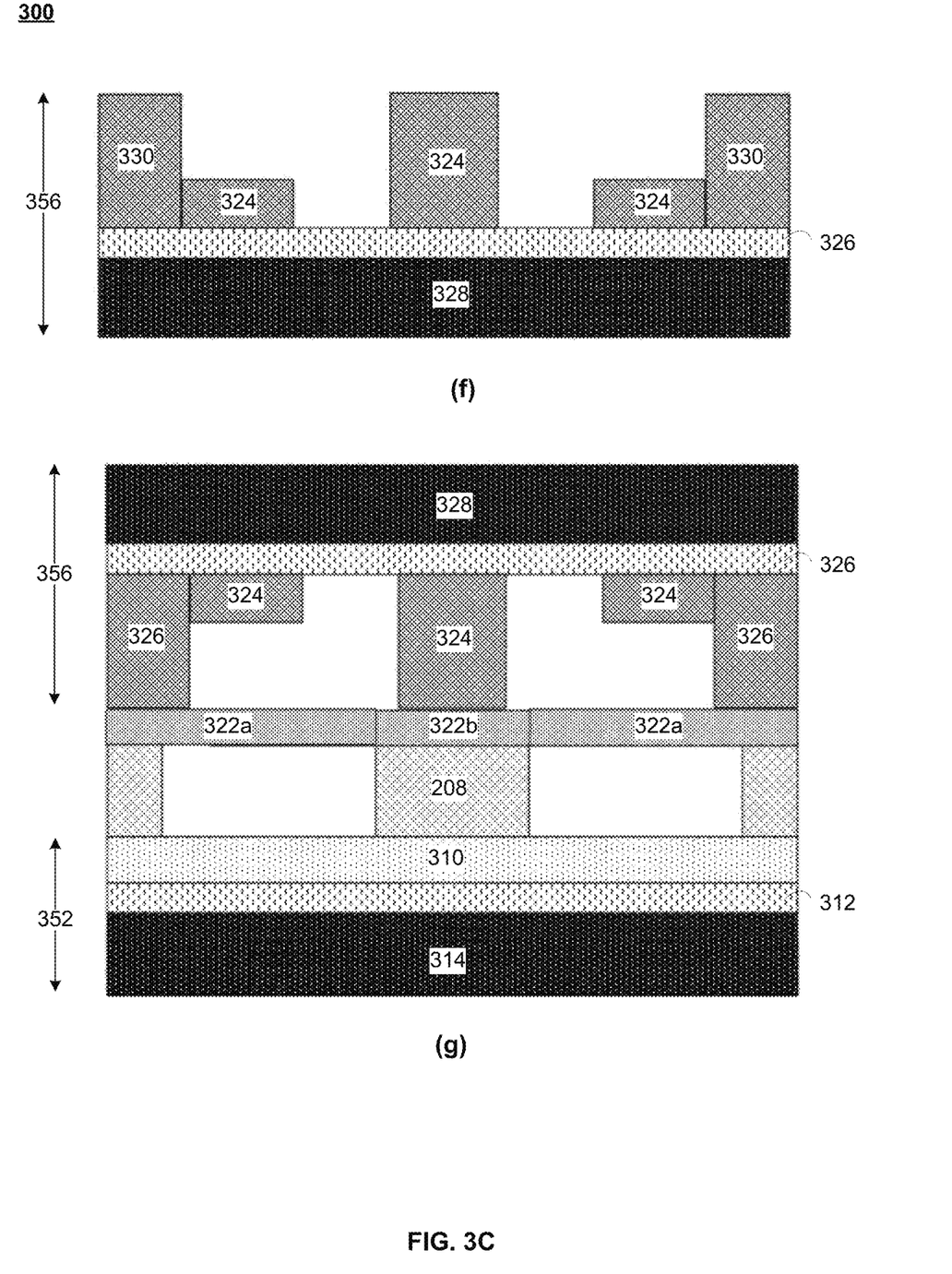
Figure 3D:
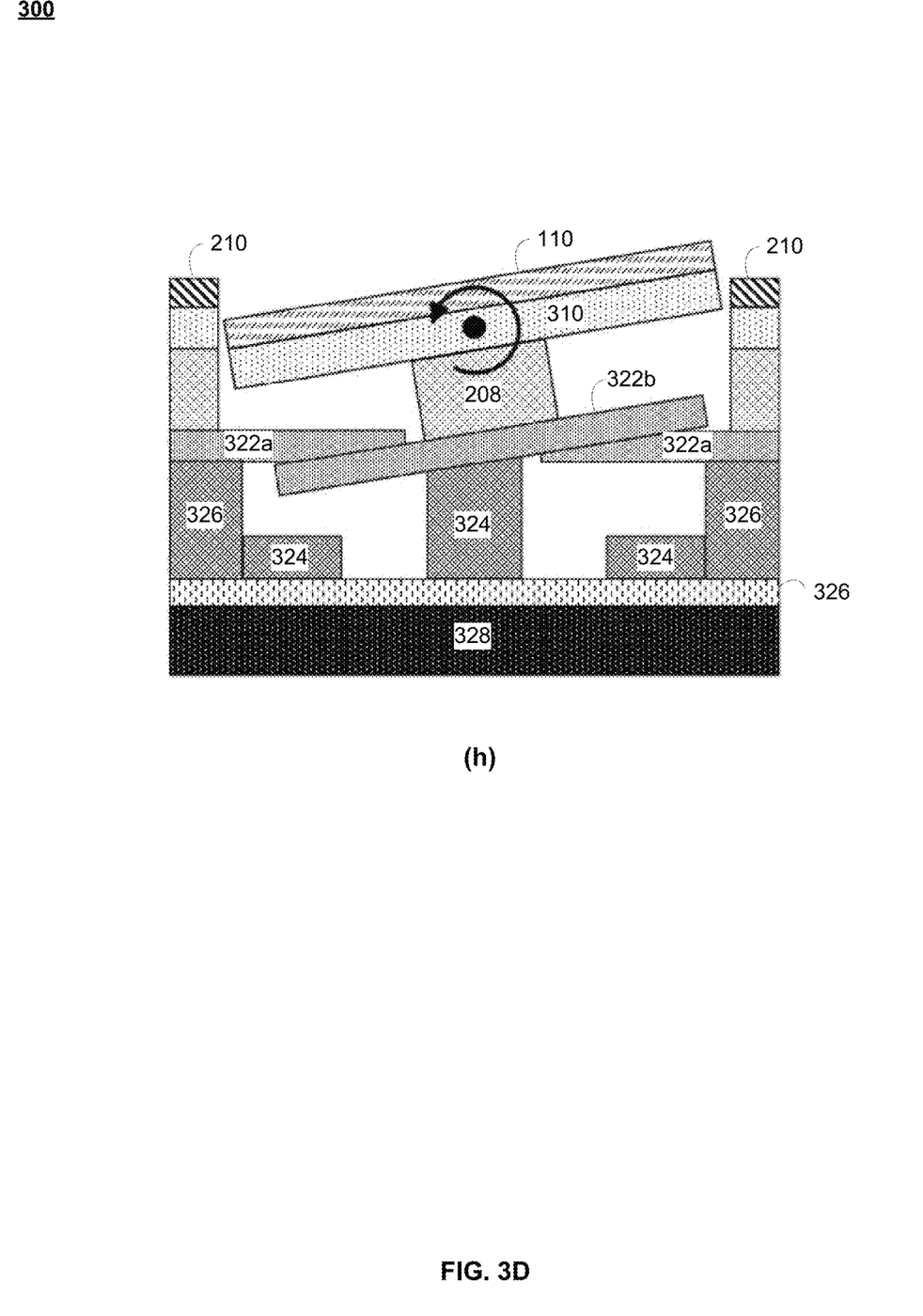

FIG. 2A illustrates a first detailed view of a scanning mirror assembly 200 included in scanner 108 of FIG. 1, according to embodiments of the disclosure. FIG. 2B illustrates a second detailed view of the lower layers of scanning mirror assembly 200 shown in FIG. 2A, according to embodiments of the disclosure. FIGS. 2A and 2B will be described together.

Referring to FIGS. 2A and 2B, scanning mirror assembly 200 may include a layer 202 (e.g., silicon layer) on which first, second, third, and fourth layers are formed. The top-down order of the layers of scanning mirror assembly 200 as described herein may include, e.g., the first layer (depicted in FIG. 2A), the third layer (depicted in FIG. 2B), the second layer (depicted in FIG. 2B), the fourth layer (depicted in FIG. 2B), and a base layer that includes substrate 202. In FIG. 2A, only the first layer elements are visible. FIG. 2A depicts scanning mirror assembly 200 with the first layer covering the layers beneath it, and therefore the second, third, and fourth layer elements are not visible. Metal contacts 240 depicted in FIG. 2A may be formed in any one of the layers. FIG. 2B depicts scanning mirror assembly 200 with the first layer removed, thus revealing the second, third, and fourth layer elements, which are located under the first layer elements in FIG. 2A.

Referring to FIG. 2A, the first layer elements may include, e.g., an array of MEMS mirrors 110, a plurality of scanning mirror anchors 204 that are each configured to rotate a corresponding MEMS mirror 110 around a first axis of rotation, a plurality of hinges 206 configured to rotate a MEMS mirror 110 around a second axis of rotation that is perpendicular to the first axis of rotation, and a perimeter 210. First layer elements depicted in FIG. 2A may be formed from a second silicon wafer, as described below in connection with FIGS. 3A-3D. A reflective coating (e.g., gold, silver, copper, etc.) may be formed on the surface of MEMS mirrors 110 and configured to reflect laser beam 109 towards object 112, as depicted in FIG. 1. An anti-reflective coating may be formed on a top surface of the non-mirror elements, such as the scanning mirror anchors 204, the hinges 206, and the perimeter 210 to attenuate any part of the laser beam that impinges upon these surfaces, which may increase the accuracy and the overall performance of the optical sensing system.

Referring to FIG. 2B, the top-down layer ordering may be, e.g., the third layer, the second layer, and the fourth layer. The third layer elements may include, e.g., a plurality of handles 208. Each handle 208 may be configured to couple a MEMS mirror 110 and its corresponding MEMS actuator, which may be in the second layer located under the third layer. The plurality of handles 208 may be formed from a first wafer during the fabrication process, as described below in connection with FIGS. 3A-3D.

Still referring to FIG. 2B, the second layer elements may include, e.g., a plurality of MEMS actuators that each comprise a plurality of stator actuator features 222a and a plurality of rotatable actuator features 222b. In certain implementations, stator actuator features 222a and rotatable actuator features 222b may be interdigitated comb drive fingers. Stator actuator features 222a may be stator comb drive fingers, and rotatable actuator features 222b may be rotatable comb drive fingers. Consistent with present disclosure, stator and rotatable actuator features 222a, 222b may be formed from a same semiconductor layer during the fabrication process, as described below in connection with FIGS. 3A-3D. By forming interdigitated stator and rotatable comb drive fingers from the same semiconductor layer during the fabrication process, issues of misalignment may be eliminated or reduced. Furthermore, the plurality of rotatable actuator features 222b may be coupled to handle 208 and configured to rotate with handle 208 and MEMS mirror 110 as a single unit during a scanning procedure performed by the scanning mirror assembly 200.

Referring again to FIG. 2B, the fourth layer elements may include, e.g., a plurality of interconnects 224 and a plurality of actuator anchors (not visible). The actuator anchors may be configured to anchor the stator actuator features 222a in a fixed position so that they do not move during a scanning procedure. An exemplary fabrication process, which may be used to form the scanning mirror assembly 200 with each of the four layers will be described below in connection with FIGS. 3A-3D.

Figure 4:
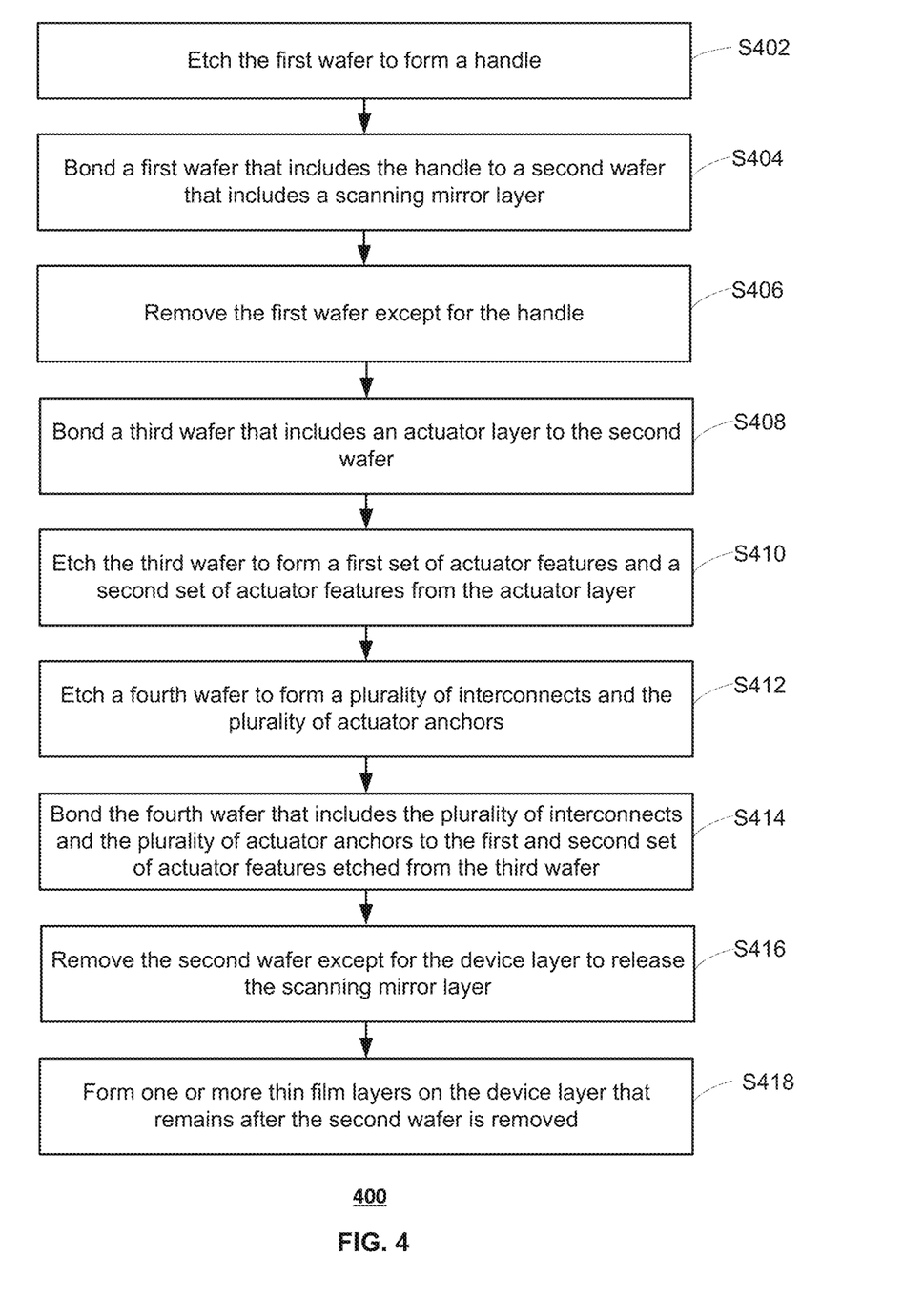
FIG. 4 illustrates a flow chart of an exemplary method for fabricating a scanning mirror assembly, according to embodiments of the disclosure.

FIGS. 3A-3D illustrate an exemplary process flow 300 for fabricating the scanning mirror assembly 200 depicted in FIGS. 2A and 2B, according to embodiments of the disclosure. Process flow 300 may include steps (a)-(h), which may be used to fabricate, e.g., four layers to host the various elements of scanning mirror assembly 200. In some embodiments, process flow 300 may be a comb drive self-alignment process that forms interdigitated stator and rotatable actuator features 222a, 222b from the same layer. FIG. 4 illustrates a flowchart of an exemplary method 400 for fabricating the scanning mirror assembly 200 depicted in FIGS. 2A and 2B, according to embodiments of the disclosure. Method 400 may include steps S402-S416 as described below. Steps (a)-(h) in FIGS. 3A-3D and steps S402-S416 in FIG. 4 may be performed by any type of fabrication system and/or device without departing from the scope of the present disclosure. As described below, a "silicon layer" may be formed of either crystalline silicon, polysilicon, and/or amorphous silicon, and an "insulating layer" may be formed of silicon dioxide or any other type of insulator known in the art. "Bonding," as described below, may be performed using any bonding technique known in the art, e.g., such as direct bonding (e.g., silicon-to-silicon), eutectic bonding (e.g., a metal interlayer between silicon layers), and/or thermocompression (e.g., two metal-coated silicon wafers bonded using pressure and a predetermined temperature), just to name a few. "Etching," as used herein, may be performed using any etching technique known in the art, e.g., such as deep reaction ion etching (DRIE) (sometimes also referred to as a "Bosch process"), dry etching, wet etching, chemical-mechanical polishing, hydrofluoric acid (HF) etching, and/or reaction ion etching, just to name a few. It is to be appreciated that some of the steps may be optional, and some of the steps may be performed simultaneously, or in a different order than shown in FIG. 4. FIGS. 3A-3D, and 4 will be described together.

Referring to FIG. 4, the fabrication process may begin at step S402. At S402, a first wafer 350 may be etched to form handle 208. An example of the first wafer 350 is illustrated at step (a) in FIG. 3A. By way of example and not limitation, first wafer 350 may be a Silicon-on-Insulator (SOI) wafer, which may include first silicon layer 302, a first insulating layer 304, and a first device layer (e.g., also a silicon layer) that is etched to form handle 208.

At S404 in FIG. 4, the first wafer 350 that includes the handle 208 may be bonded to a second wafer 352 that includes a scanning mirror layer. An example of the second wafer 352 bonded to the first wafer 350 is illustrated at step (b) in FIG. 3A. Second wafer 352 may include a second device layer 310 (e.g., scanning mirror layer), a second insulating layer 312, and a second silicon layer 314. Referring to step (b) in FIG. 3A, second wafer 352 may be bonded to first wafer 350 using any known technique.

At S406 in FIG. 4, after the bonding in step (b), the first wafer 350 may be removed except for the handle 208. For example, first silicon layer 302 and first insulating layer 304 can be removed using any known etching process. Referring to step (c) in FIG. 3A, first silicon layer 302 and first insulating layer 304 have been removed from first wafer 350, releasing the handle 208. Second wafer 352 with handle 208 bonded thereto is then flipped over as shown in step (c) of FIG. 3A, so that second silicon layer 314 becomes the bottom layer.

At S408 in FIG. 4, a third wafer 354 that includes an actuator layer may be bonded to second wafer 352. An example of third wafer 354 is illustrated at step (d) in FIG. 3B. Third wafer 354 may include third device layer 316, third insulating layer 318, and third silicon layer 320. Because handle 208 is released when first silicon layer 302 and first insulating layer 304 are removed in step (c), third wafer 354 may be bonded directly to the layer that includes handle 208 on one side, which is bonded to second wafer 352 on the other side.

At S410 in FIG. 4, third wafer 354 may be etched to form stator actuator features 222a (e.g., a first set of actuator features) and rotatable actuator features 222b (e.g., a second set of actuator features) from third device layer 316 (e.g., actuator layer). Referring to step (e) in FIG. 3B, interdigitated stator and rotatable actuator features 222a, 222b may be formed using any etching process that achieves self-aligned actuator features. As part of S410, third insulating layer 318 and third silicon layer 320 are removed after the actuator features are formed, as shown in step (e) of FIG. 3B. After bonding at step (d) in FIG. 3B, the third silicon layer 320 is removed and the third insulating layer 318 is etched. Then, device layer 316 is flat and ready to process. Photoresist (e.g., a lithography process) may be spin coated and developed to form the interdigitated stator and rotatable actuator features 222a, 222b. Because this a single lithography step, the interdigitated stator and rotatable actuator features 222a, 222b are aligned with a high degree of accuracy because the lithography exposure apparatus can resolve features to within in the nanometer (nm) range. After device layer 316 may be etched DRIE. Device layer 316 may have a thickness is in the range of 50 μm to 200 μm, which may impart a high degree of strength to interdigitated stator and rotatable actuator features 222a, 222b.

At S412 in FIG. 4, a fourth wafer 356 may be etched to form a plurality of interconnects 324 and the plurality of actuator anchors 330. An example of fourth wafer 356 is illustrated at step (f) in FIG. 3C. Fourth wafer 356 may include a fourth device layer into which the interconnects 324 (e.g., silicon) and actuator anchors 330 are etched, a fourth insulating layer 326, and a fourth silicon layer 328.

At S414 in FIG. 4, fourth wafer 356 that includes the plurality of interconnects 324 and a plurality of actuator anchors 330 formed in S412 may be bonded to the first and second set of actuator features 222a, 222b etched from third wafer 354 in S410. Referring to step (g) in FIG. 3C, fourth wafer 356 may be bonded to second wafer 352 via first and second actuator features 222a, 222b. Fourth wafer 356 of step (f) may be bonded to first and second actuator features 222a, 222b in structure of step (e) using any known bonding technique.

At S416 in FIG. 4, second wafer 352 may be removed to release MEMS mirror 110 from the second device layer 310 (e.g., scanning mirror layer). Referring to step (h) in FIG. 3D, second wafer 352 may be etched to remove second silicon layer 314 and second insulating layer 312 and release MEMS mirror 110.

At S418 in FIG. 4, one or more thin film layers may be deposited and patterned on second device layer 310 after second silicon layer 314 and second insulating layer 312 have been removed. For example, a reflective coating (e.g., gold, silver, copper, etc.) may be formed and patterned on the portion(s) of device layer 310 that corresponds to MEMS mirrors 110. Additionally and/or alternatively, an anti-reflective coating may be formed on portion(s) of device layer 310 that correspond to a top surface of the non-mirror elements, e.g., such as the scanning mirror anchors 204, the hinges 206, and the perimeter 210, to attenuate any part of the laser beam that impinges upon these surfaces, which may increase the accuracy and the overall performance of the optical sensing system. Certain portion(s) of the thin film layers patterned onto second wafer 352 may be removed using a liftoff technique and/or etching technique.

The scanning mirror assembly formed in step (h) may have a scanning mirror 110 elevated above its actuator (e.g., stator and rotatable actuator features 222a, 222b) by a predetermined distance, e.g., the thickness of handle 208. After step (h), the completed scanning mirror assembly may be included in a scanner of an optical sensing system, e.g., such as scanner 108 of LiDAR system 100 in FIG. 1. As previously mentioned, the optical sensing system may be configured to perform a scanning procedure to generate a point cloud of objects in the far field. During the scanning procedure, a drive voltage may be applied to the stator and/or rotatable actuator features 222a, 222b such that the scanning mirror 110 is driven into oscillation. Because the rotatable actuator features 222b are coupled to handle 208 in the manner described above in connection with FIGS. 3A-3D and 4, rotatable actuator features 222b rotate with handle 208 and scanning mirror 110 as a single unit during the scanning procedure.

This arrangement increases the fill factor by elevating the reflective surface of the scanning mirror 110 above its corresponding actuator 222a, 222b. This enables the surface area of the present scanning mirror 110 to be increased so that it fills in the space that would otherwise have been occupied by the MEMS actuator in a conventional assembly. At the same time, by forming interdigitated stator and rotatable features 222a, 222b of the MEMS actuator in the same semiconductor layer, issues of misalignment, which may otherwise occur when the stator and rotatable features 222a, 222b are formed from separate layers, may be mitigated. Thus, the scanning mirror assembly of the present disclosure not only has an improved fill factor, but its performance and lifespan may also be enhanced by mitigating misalignment between corresponding stator and rotatable features 222a, 222b, of the MEMS actuator.

Another aspect of the disclosure is directed to a non-transitory computer-readable medium storing instructions which, when executed, cause one or more processors to perform the methods, as discussed above, e.g., the process of fabricating a scanning mirror assembly with a scanning mirror elevated above its corresponding actuator by a predetermined distance, which is the thickness of a handle that couples the scanning mirror and its actuator. The computer-readable medium may include volatile or non-volatile, magnetic, semiconductor-based, tape-based, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon. It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. A scanning mirror assembly for an optical sensing system, comprising:
    a scanning mirror formed in a first layer of the scanning mirror assembly; and
    a microelectromechanical system (MEMS) actuator formed in a second layer of the scanning mirror assembly, wherein the first layer is a predetermined distance above the second layer,
        wherein the MEMS actuator include a plurality of stator actuator features and a plurality of rotatable actuator features formed from a same semiconductor layer during a fabrication process.

2. The scanning mirror assembly of claim 1, further comprising:
    a handle formed in a third layer between the first layer and the second layer to couple the scanning mirror and the MEMS actuator and keep the scanning mirror and the MEMS actuator at the predetermined distance apart.

3. The scanning mirror assembly of claim 2, wherein the plurality of rotatable actuator features is coupled to the handle and configured to rotate with the handle and the scanning mirror as a single unit during a scanning procedure performed by the scanning mirror assembly.

4. The scanning mirror assembly of claim 2, further comprising:
    a plurality of interconnects formed in a fourth layer beneath the second layer; and
    a plurality of actuator anchors formed in the fourth layer.

5. The scanning mirror assembly of claim 4, wherein the handle is formed in a first wafer, the scanning mirror is formed in a second wafer bonded to the first wafer, the MEMS actuator is formed in a third wafer bonded to the second wafer, and the plurality of interconnects and the plurality of actuator anchors are formed in a fourth wafer bonded to the third wafer.

6. The scanning mirror assembly of claim 5, wherein at least one of the first wafer, the second wafer, the third wafer, and the fourth wafer is a Silicon on Insulator (SOI) wafer.

7. The scanning mirror assembly of claim 1, wherein the plurality of stator actuator features comprises a plurality of stator comb drive fingers and the plurality of rotatable actuator features comprises a plurality of rotatable comb drive fingers.

8. The scanning mirror assembly of claim 7, further comprising:
    a set of actuator anchors coupled to the plurality of stator actuator features and configured to maintain the plurality of stator actuator features in a stationary position during a scanning procedure performed by the scanning mirror assembly.

9. A transmitter for an optical sensing system, comprising:
    a light source configured to emit a light beam towards an object; and
    a scanning mirror assembly that comprises:
        a scanning mirror formed in a first layer of the scanning mirror assembly; and
        a microelectromechanical system (MEMS) actuator formed in a second layer of the scanning mirror assembly, wherein the first layer is a predetermined distance above the second layer,
            wherein the MEMS actuator include a plurality of stator actuator features and a plurality of rotatable actuator features formed from a same semiconductor layer during a fabrication process.

10. The transmitter of claim 9, wherein the scanning mirror assembly further comprises:
    a handle formed in a third layer between the first layer and the second layer to couple the scanning mirror and the MEMS actuator and keep the scanning mirror and the MEMS actuator at the predetermined distance apart.

11. The transmitter of claim 10, wherein the plurality of rotatable actuator features is coupled to the handle and configured to rotate with the handle and the scanning mirror as a single unit during a scanning procedure performed by the scanning mirror assembly.

12. The transmitter of claim 10, wherein the scanning mirror assembly further comprises:
    a plurality of interconnects formed in a fourth layer beneath the second layer; and
    a plurality of actuator anchors formed in the fourth layer.

13. The transmitter of claim 12, wherein the handle is formed in a first wafer, the scanning mirror is formed in a second wafer bonded to the first wafer, the MEMS actuator is formed in a third wafer bonded to the second wafer, and the plurality of interconnects and the plurality of actuator anchors are formed in a fourth wafer bonded to the third wafer.

14. The transmitter of claim 13, wherein at least one of the first wafer, the second wafer, the third wafer, and the fourth wafer is a Silicon on Insulator (SOI) wafer.

15. The transmitter of claim 9, wherein the plurality of stator actuator features comprises a plurality of stator comb drive fingers and the plurality of rotatable actuator features comprises a plurality of rotatable comb drive fingers.

16. The transmitter of claim 15, wherein the scanning mirror assembly further comprises:
a set of actuator anchors coupled to the plurality of stator actuator features and configured to maintain the plurality of stator actuator features in a stationary position during a scanning procedure performed by the scanning mirror assembly.

\* \* \* \* \*